US010256354B2

(12) United States Patent
Hilali et al.

(10) Patent No.: US 10,256,354 B2
(45) Date of Patent: Apr. 9, 2019

(54) SILOXANE-CONTAINING SOLAR CELL METALLIZATION PASTES

(71) Applicant: Zhejiang Kaiying New Materials Co., Ltd., Zhejiang (CN)

(72) Inventors: Mohamed M. Hilali, San Ramon, CA (US); Zhang Wei, Zhejiang (CN); Zhiyong Li, Los Altos, CA (US)

(73) Assignee: ZHEJIANG KAIYING NEW MATERIALS CO., LTD., Zhejiang (CN)

( * ) Notice: Subject to any disclaimer, the term of this patent is extended or adjusted under 35 U.S.C. 154(b) by 0 days.

(21) Appl. No.: 16/102,088

(22) Filed: Aug. 13, 2018

(65) Prior Publication Data

US 2018/0351011 A1    Dec. 6, 2018

Related U.S. Application Data

(60) Division of application No. 15/849,344, filed on Dec. 20, 2017, now Pat. No. 10,079,318, which is a continuation of application No. PCT/CN2016/111036, filed on Dec. 20, 2016.

(51) Int. Cl.
| | |
|---|---|
| *H01L 31/00* | (2006.01) |
| *H01B 1/22* | (2006.01) |
| *B05D 5/12* | (2006.01) |
| *H01L 31/0224* | (2006.01) |
| *H01L 31/028* | (2006.01) |
| *H01L 31/068* | (2012.01) |
| *H01B 1/16* | (2006.01) |
| *C09D 5/24* | (2006.01) |

(52) U.S. Cl.
CPC ........ *H01L 31/02245* (2013.01); *B05D 5/12* (2013.01); *C09D 5/24* (2013.01); *H01B 1/16* (2013.01); *H01B 1/22* (2013.01); *H01L 31/0284* (2013.01); *H01L 31/068* (2013.01)

(58) Field of Classification Search
CPC ... H01B 1/00; H01B 1/16; H01B 1/22; B05D 5/12; H01L 31/02245; H01L 31/0284; H01L 31/068
See application file for complete search history.

(56) References Cited

U.S. PATENT DOCUMENTS

| | | |
|---|---|---|
| 7,300,606 B2 | 11/2007 | Chung et al. |
| 8,093,491 B2 | 1/2012 | Sridharan et al. |
| 8,952,245 B2 | 2/2015 | Wang et al. |
| 9,209,323 B2 | 12/2015 | Hayashi et al. |

(Continued)

FOREIGN PATENT DOCUMENTS

| | | |
|---|---|---|
| CN | 101948639 | 1/2011 |
| CN | 102290120 | 12/2011 |

(Continued)

OTHER PUBLICATIONS

Kim et al., "Capillary flow of amorphous metal for high performance electrode," Scientific Reports, 2013, vol. 3, No. 2185, 7 pages.

(Continued)

*Primary Examiner* — Mark Kopec

(57) ABSTRACT

Frontside metallization pastes for solar cell electrodes contain siloxanes. Metallization pastes containing siloxanes can be used to fabricate fine line, high aspect ratio, solar cell gridlines.

18 Claims, 2 Drawing Sheets

(56) References Cited

U.S. PATENT DOCUMENTS

| | | |
|---|---|---|
| 9,834,470 B1 | 12/2017 | Hilali et al. |
| 10,079,318 B2 * | 9/2018 | Hilali .................. C09D 5/24 |
| 2010/0308462 A1 | 12/2010 | Konno et al. |
| 2011/0120531 A1 | 5/2011 | Nese et al. |
| 2011/0308597 A1 | 12/2011 | Carroll et al. |
| 2011/0315217 A1 | 12/2011 | Gee et al. |
| 2012/0015472 A1 | 1/2012 | Hayashi et al. |
| 2012/0122272 A1 | 5/2012 | Rana et al. |
| 2013/0118572 A1 | 5/2013 | Kim et al. |
| 2013/0126797 A1 | 5/2013 | Lee et al. |
| 2013/0255770 A1 | 10/2013 | Carroll et al. |
| 2013/0341769 A1 | 12/2013 | Koehler et al. |
| 2014/0299187 A1 | 10/2014 | Chang et al. |
| 2014/0338747 A1 | 11/2014 | Choi et al. |
| 2015/0129030 A1 | 5/2015 | Kapur et al. |
| 2015/0144183 A1 | 5/2015 | Yang et al. |
| 2015/0243807 A1 | 8/2015 | Raskar et al. |
| 2015/0249167 A1 | 9/2015 | Zhang et al. |
| 2015/0280024 A1 | 10/2015 | Song et al. |
| 2015/0333197 A1 | 11/2015 | Takeda et al. |
| 2015/0364622 A1 | 12/2015 | Jung et al. |
| 2016/0170192 A1 | 6/2016 | Yamamoto et al. |
| 2016/0251531 A1 | 9/2016 | Uchida et al. |
| 2017/0087633 A1 | 3/2017 | Murano et al. |
| 2017/0306172 A1 | 10/2017 | Koduma |

FOREIGN PATENT DOCUMENTS

| | | |
|---|---|---|
| CN | 102592708 | 7/2012 |
| CN | 104036842 | 9/2014 |
| CN | 104103699 | 10/2014 |
| CN | 104167454 | 11/2014 |
| CN | 104282357 | 1/2015 |
| CN | 104599741 | 5/2015 |
| CN | 104681648 | 6/2015 |
| CN | 104867535 | 8/2015 |
| CN | 105261669 | 1/2016 |
| CN | 106158068 | 11/2016 |
| CN | 106297956 | 1/2017 |
| KR | 20020060926 | 7/2002 |
| KR | 101377555 | 3/2014 |

OTHER PUBLICATIONS

BYK-336 Silicone surface additive product data sheet, Sep. 2012, 1 page.
BYK Additives & Instruments Paint Additives, Feb. 2009, 15 pages.
Sigma Aldrich, Product Specification for No. 176206, poly(methylhydrosiloxane), MW 1,700-3,200, Dec. 28, 2010, 1 page.
Non-Final Office Action for U.S. Appl. No. 15/663,296, dated Sep. 14, 2017, 8 pages.
Non-Final Office Action for U.S. Appl. No. 15/663,187, dated Nov. 15, 2017, 6 pages.
Non-Final Office Action for U.S. Appl. No. 15/839,585, dated Feb. 5, 2018, 17 pages.
Non-Final Office Action for U.S. Appl. No. 15/849,344, dated Mar. 22, 2018, 12 pages.
International Search Report and Written Opinion for International Application No. PCT/CN2016/095508, dated May 5, 2017, 8 pages.
International Search Report and Written Opinion for International Application No. PCT/CN2016/111036, dated Sep. 1, 2017, 9 pages.
International Search Report and Written Opinion for International Application No. PCT/CN2016/111035, dated Sep. 27, 2017, 8 pages.

* cited by examiner

SILOXANE-CONTAINING SOLAR CELL METALLIZATION PASTES

This application is a Divisional of U.S. application Ser. No. 15/849,344, filed on Dec. 20, 2017, now U.S. Pat. No. 10,079,318, which is a Continuation of International Application No. PCT/CN2016/111036 filed on Dec. 20, 2016, each of which is incorporated by reference in its entirety.

FIELD

Screen-printable metallization pastes for use in the fabrication of solar cell electrodes are disclosed. The solar cell metallization pastes contain siloxane.

BACKGROUND

Solar cells are manufactured in high volume using high throughput production methods. In high volume production solar cell metallization paste can be screen-printed at a rate of 3,500 wafers/hour. To reduce costs and improve solar cell performance it is desirable that the dimensions of front side electrodes be reduced. In high volume production, front side electrodes are typically fabricated by screen printing a metallization paste through a fine wire mesh. It is challenging to achieve integral fine-line front-side grid metallization having an aspect ratio greater than about 0.4 without discontinuities when printing metallization pastes through screens having openings less than 38 µm. Currently, screen openings can be around 34 µm. Line discontinuity can occur when the paste passes through the screen openings in the wire mesh, and the percent open area is smaller than the emulsion pattern of the gridline. The intersecting wires that form the printing mesh can also result in an interference or 'necking' pattern of the screen-printed gridlines that may show intervals of narrow widths that lead to increased gridline resistance. Also, if the paste is not well designed, the width of the printed gridlines can be up to 50% wider than the screen opening.

To provide an economical process for manufacturing solar cell gridlines, there is a need for thick-film metallization pastes that can be screen-printed through fine mesh screens at high speeds such as greater than 200 mm/sec, greater than 300 mm/sec, or greater than 350 mm/sec to provide conductive grids with small feature dimensions and high aspect ratios, and that exhibit low resistivity, high adhesion strength to the semiconductor substrate, and excellent solderability.

SUMMARY

According to the present invention, a metallization paste comprises from 0.01 wt % to 3 wt % of a siloxane, wherein the siloxane comprises a polysiloxane, a polysiloxane-modified resin, or a combination thereof; and wt % is based on the total weight of the metallization paste.

According to the present invention, invention, a solar cell electrode is prepared by applying the metallization paste of claim 1 to a surface of a solar cell; drying the applied metallization paste; and firing the dried metallization paste to provide a solar cell electrode.

According to the present invention, a method of fabricating a solar cell electrode, comprises applying the metallization paste of claim 1 to a surface of a solar cell; drying the applied metallization paste; and firing the dried metallization paste to provide a solar cell electrode.

BRIEF DESCRIPTION OF THE DRAWINGS

Those skilled in the art will understand that the drawings described herein are for illustration purposes only. The drawings are not intended to limit the scope of the present disclosure.

DETAILED DESCRIPTION

Figure 1:
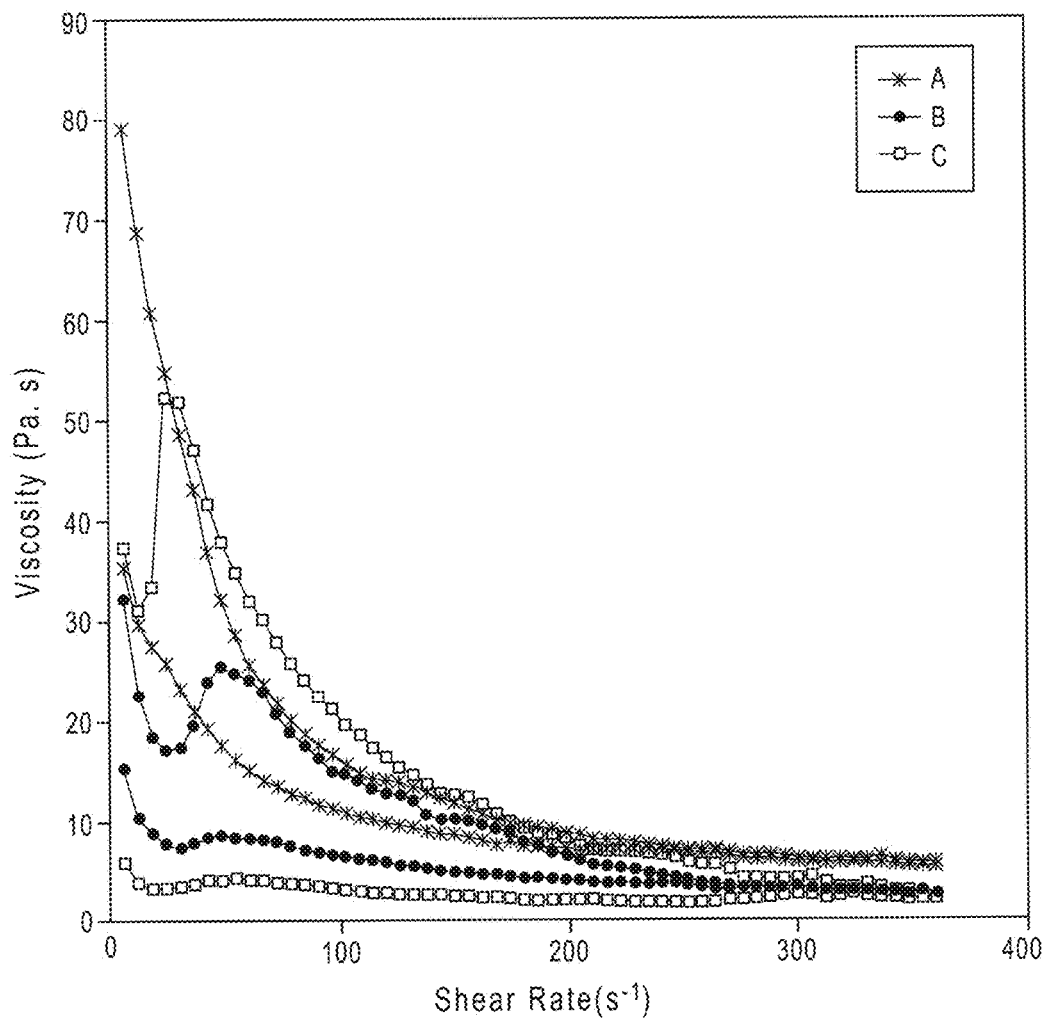
FIG. 1 is a graph showing the shear-thinning flow with shear rate for metallization pastes with and without a siloxane.

Solar cell metallization pastes comprising a siloxane can provide high performance solar cell gridlines with small feature dimensions.

Siloxanes can reduce the surface tension and increase the hydrophobicity of a solar cell metallization paste and thereby facilitate the ability of the metallization paste to flow through a fine wire mesh without forming discontinuities in the printed gridlines. Small feature gridlines reduce optical shading and increase the overall photocurrent generated by a solar cell. Siloxanes can also act as defoamers and can reduce the wet weight of the printed paste. The addition of siloxanes to a metallization paste does not adversely affect the electrical properties of the fired gridlines compared to corresponding gridlines fabricated using metallization pastes without a siloxane.

A solar cell metallization paste can comprise a siloxane, silver (Ag) particles, glass frit, and a an organic vehicle. An organic vehicle can comprise an organic binder, solvent, and additives.

A metallization paste can also comprise a siloxane or a combination of siloxanes.

A siloxane can comprise a polysiloxane, a polysiloxane-modified resin, or a combination thereof. A siloxane refers to a polymer having repeating siloxane —O—Si—O— groups. A siloxane can have any suitable terminal groups such as a terminal alkoxysilyl group, hydroxyl group (—OH), alkenyl group (—CH=CH$_2$), or epoxy group.

An alkoxysilyl group can have the structure —Si(—R$^1$)$_m$(—R$^2$)$_{3-m}$, where R$^1$ is C$_{1-6}$ alkyl, R$^2$ is C$_{1-6}$ alkoxy, and m is an integer from 1 to 3. R$^1$ can be, for example, methyl or ethyl, and R$^2$ can be methoxy or ethoxy, and m can be 1, 2, or 3.

A polysiloxane can be a homopolymer, a copolymer, or a combination thereof. A polysiloxane can have organic groups pendent to the polysiloxane backbone, at both ends of the polysiloxane chain, at one end of the polysiloxane chain, or pendent to the polysiloxane backbone and at one or both ends of the polysiloxane chain.

Examples of suitable polysiloxane homopolymers include hexamethylsiloxane, bis(3-aminopropyl) terminated poly(dimethylsiloxane), poly(dimethylsiloxane, diglycidyl ether-terminated (polydimethylsiloxane), hydride-terminated (polydimethylsiloxane), hydroxy-terminated (poly-dimethylsiloxane), monoacrylamidopropyl-terminated (polydimethylsiloxane), vinyl-terminated (polydimethylsiloxane), poly(methylhydrosiloxane), trimethylsilyl-terminated poly(methylhydrosiloxane), poly(methylphenylsiloxane), and combinations of any of the foregoing.

Examples of suitable polysiloxane copolymers include poly(dimethylsiloxane-co-alkylmethylsiloxane), poly(dimethylsiloxane-co-(3-aminopropyl)methylsiloxane), dihydroxy-terminated poly(dimethylsiloxane-co-diphenylsiloxane), divinyl-terminated poly(dimethylsiloxane-co-diphenylsiloxane), poly[dimethylsiloxane-co-(2-(3,4-epoxycyclohexyl)ethyl)methylsiloxane], poly[dimethylsiloxane-co-[3-(2-(2-hydroxyethoxy)ethoxy)propyl]methylsicoxane], trimethylsilyl-terminated poly(dimethylsiloxane-co-methylhydrosiloxane), poly(dimethylsiloxane-co-methylphenylsiloxane), poly(dimethylsiloxane-co-methyl(stearoyloxyalkyl)siloxane], poly(dimethylsiloxane)-graft-polyacrylates, and combinations of any of the foregoing.

A polysiloxane can comprise poly(dimethylsiloxane), poly(methylhydrosiloxane) or a combination thereof. A polysiloxane can comprise an alkylsilyl-terminated poly(dimethylsiloxane), an alkoxysilyl-terminated poly(methylhydrosiloxane), or a combination thereof. A polysiloxane can comprise a trimethylsilyl-terminated poly(dimethylsiloxane), an trimethyl-terminated poly(methylhydrosiloxane), or a combination thereof.

A siloxane can comprise a poly(methylhydrosiloxane) or a combination of poly(methylhydrosiloxane). A polysiloxane can comprise a poly(dimethylsiloxane), or a combination of poly(dimethylsiloxanes).

A polysiloxane such as a poly(methylhydrosiloxane) or a poly(dimethylsiloxane), can have an average molecular weight, for example, from 500 Daltons to 5,000 Daltons, from 750 Daltons to 4,500 Daltons, from 1,000 Daltons to 4,000 Daltons or from 1,500 Daltons to 4,500 Daltons. A polysiloxane such as a poly(methylhydrosiloxane) or a poly(dimethylsiloxane), can have an average molecular weight, for example, from 1,000 Daltons to 100,000 Daltons, from 1,000 Daltons to 50,000 Daltons, or from 3,000 Daltons to 25,000 Daltons. Molecular weight can be determined using gel permeation chromatography using polystyrene standards.

A polysiloxane can be characterized by a viscosity, for example, from 5 cSt to 100 cSt, from 5 cSt to 75 cSt, or from 10 cSt to 50 cSt.

A siloxane can comprise a polysiloxane-modified resin.

A resin used as an organic vehicle in a metallization paste can be modified to improve printability and printed line definition. In the polysiloxane-modified resin, one or more of the terminal and/or pendent groups of the resin can be modified to provide a desired property. A modifying group can be a reactive group intended to chemically react with one or more other components of the metallization paste or a modifying group can be change a physical property of the metallization paste.

Polysiloxane-modified resins include polysiloxane-modified block copolymers and polysiloxane-modified graft copolymers.

A polysiloxane-modified block copolymer comprises segments of a polysiloxane and segments of another polymeric resin in the copolymer backbone. The two segments comprising a block copolymer can be alternating. In a polysiloxane-modified block copolymer having reactive functional groups a polysiloxane can reacted with a polymeric resin having functional groups that are reactive with the functional groups of the polysiloxane.

Examples of suitable polymeric resins include acrylics, urethanes, epoxies, polyimides, polyethers, and polycarbonates. Other suitable polymers can be used such as polymeric resins typically used in solar cell grid line metallization pastes.

A polysiloxane-modified resin can comprise a graft copolymer in which polysiloxanes are grafted onto a polymeric resin backbone. The polysiloxanes form moieties that are pendent from the backbone of the polymeric resin.

Any of the polysiloxanes disclosed herein having or modified to have a suitable reactive group can be reacted with appropriate reactive groups of a polymeric resin to provide suitable polysiloxane-modified block copolymers are/or polysiloxane-modified graft copolymers.

Examples of suitable polysiloxane-modified resins include polysiloxane-modified alkyd resins, polysiloxane-modified polyester resins, a polysiloxane-modified epoxy resins, polysiloxane-modified acrylic resins, polysiloxane-modified cellulose resins, or a combination of any of the foregoing. Such polysiloxane-modified resins can be block copolymers, graft copolymers, or a combination of block and graft copolymers.

A solar cell metallization paste can comprise, for example, from 0.01 wt % to 5 wt %, from 0.01 wt % to 4 wt %, from 0.01 wt % to 3 wt %, from 0.1 wt % to 2 wt %, or from 0.1 wt % to 1 wt % of a siloxane or a combination of siloxanes, where wt % is based on the total weight of the metallization paste.

A siloxane can have a molecular weight, for example, from 250 Daltons to 30,000 Daltons, from 500 Daltons to 25,000 Daltons, from 500 Daltons to 20,000 Daltons, from 1,000 Daltons to 15,000 Daltons or from 2,000 Daltons to 5,000 Daltons.

A siloxane can be characterized by a surface tension, for example, from 15 dyn/cm to 30 dyn/cm, from 17 dyn/cm to 28 dyn/cm, from 19 dyn/cm to 26 dyn/cm, or from 21 dyn/cm to 24 dyn/cm. A polysiloxane such as polydimethylsiloxane can be characterized by a surface tension, for example, from 15 dyn/cm to 30 dyn/cm, from 17 dyn/cm to 28 dyn/cm, from 19 dyn/cm to 26 dyn/cm, or from 21 dyn/cm to 24 dyn/cm.

Metallization pastes can comprise an organic resin or combination of organic resins, which serve as binders.

An organic binder, also referred to as an organic resin, can be used to impart a desired viscosity and/or rheological property to a metallization paste to facilitate screen printing solar cell electrodes. The organic resin can also facilitate homogeneous dispersion of the inorganic component of the metallization paste within the printable composition. Some or all of the organic binder can be replaced with a siloxane.

Suitable organic binders include, for example, acrylate resins and cellulose resins such as ethylcellulose, ethyl hydroxyethylcellulose, nitrocellulose, blends of ethylcellulose and phenol resins, alkyd resins, phenol resins, acrylate esters, xylenes, polybutanes, polyesters, ureas, melamines, vinyl acetate resins, wood rosin, polymethacrylates of alcohols, and combinations of any of the foregoing.

Other suitable resins include, for example, acrylates, diallylphthalates, epoxides, polyimides, furans, melamines, parylenes, phenol-formaldehydes, methylmethacrylates, polyesters, urea-formaldehydes, urethanes, polyacetals, polyacrylates, polyamides, polyamide-imides, polybutylene terephthalates, polycarbonates, polyether ketones, polyethylenes, polyphenylene sulfides, polypropylenes, polystyrenes, polysulfones, polyvinyl butyrals, polyvinyl chlorides, and combinations of any of the foregoing.

Other suitable resins include, for example, ethyl cellulose, cellulose ester (CAB, CAP), polyacrylate, polysiloxane (modified), polyvinyl butyral (PVB), polyvinyl pyrrolidone (PVP), saturated polyester, non-reactive polyamide (PA), modified polyether, and combinations of any of the foregoing. Other resins characterized by medium polarity may also be used. In certain embodiments, a resin comprises ethylcellulose.

An organic binder may be present in an amount from 0.1 wt % to 10 wt %, from 0.1 wt % to 6 wt %, from 0.2 wt % to 4 wt %, from 0.2 wt % to 2 wt %, or from 0.2 wt % to 1 wt %, where wt % is based on the total weight of the printable composition.

An organic resin can be modified to provide improved printability and printed line definition. An organic resin may be modified with a polysiloxane to provide either a block copolymer, a graft copolymer, or a combination thereof.

For example, a polysiloxane-modified resin can include polysiloxane-modified acrylate resins and polysiloxane-modified cellulose resins such as polysiloxane-modified ethylcellulose, polysiloxane-modified ethyl hydroxyethylcellulose, polysiloxane-modified nitrocellulose, polysiloxane-modified blends of ethylcellulose and polysiloxane-modified phenol resins, polysiloxane-modified alkyd resins, polysiloxane-modified phenol resins, polysiloxane-modified acrylate esters, polysiloxane-modified xylenes, polysiloxane-modified polybutanes, polysiloxane-modified polyesters, polysiloxane-modified ureas, polysiloxane-modified melamines, polysiloxane-modified vinyl acetate resins, polysiloxane-modified wood rosin, polysiloxane-modified polymethacrylates of alcohols, and combinations of any of the foregoing.

Other suitable polysiloxane-modified resins include, for example, polysiloxane-modified ethyl cellulose, polysiloxane-modified cellulose ester (CAB, CAP), polysiloxane-modified polyacrylate, polysiloxane-modified polyvinyl butyral (PVB), polysiloxane-modified polyvinyl pyrrolidone (PVP), saturated polyester, polysiloxane-modified polyamide (PA), polysiloxane-modified polyethers, and combinations of any of the foregoing. In certain embodiments, a polysiloxane-modified resin comprises polysiloxane-modified ethyl cellulose.

A polysiloxane-modified resin can comprise a silicone-modified alkyd resin, a polysiloxane-modified polyester resin, a polysiloxane-modified acrylic resin, or a combination of any of the foregoing.

Siloxanes can also include silane-modified resins. As with siloxane-modified resins, a silane-modified resin can include a silane-modified copolymer, a silane-modified grafted polymer, or a combination thereof. A silane comprises an alkoxysilyl group and a reactive group. The alkoxysilyl group can have the structure —$Si(OR)_3$, where each R is independently selected from $C_{1-6}$ alkyl, such as methyl, ethyl, and n-propyl. The reactive group can be, for example, an amino group, and epoxy, a thiol, an isocyanate, an alkenyl, hydroxyl, or an acid anhydride. The reactive group can be selected to co-react with a reactive functional group of the polymer resin. The reactive group of the polymer resin may be a terminal group, a pendent group, or both a terminal group and a pendent group. In the silane, the alkoxysilyl group and the reactive group can be separated by a linking group. In certain embodiments, a silane comprises two or more reactive groups.

A silane having two or more reactive groups can be reacted with a polymer resin to form a silane-containing polymer resin. A silane having one reactive group can be reacted with a polymer resin to provide a polymer resin having terminal or pendent moieties terminated with alkoxysilyl groups.

Silanes can be low molecular weight compounds such as characterized by a molecular weight, for example, less than 2,000 Daltons, less than 1,500 Daltons, less than 1,000 Daltons, or less than 500 Daltons.

Reactive silanes and reactive siloxanes are available, for example, from Gelest, Inc., Shin-Etsu Chemical Co., Ltd, and from NuSil.

A siloxane can be the main solid of the organic binder in a metallization paste.

Siloxanes can show shear-thinning behavior when used in low concentration and can yield appropriate thixotropic properties with a suitable storage modulus behavior at high shear rate.

A siloxane can include hydrophobic terminal groups such as alkyl groups such as methyl, ethyl and propyl groups, cycloalkyl groups, and arene groups such as phenyl groups.

A siloxane can comprise a poly(methylhydrosiloxane) characterized by a molecular weight from 1,000 Daltons to 6,000 Daltons, from 1,200 Daltons, to 5,000 Daltons, from 1,200 Daltons to 4,000 Daltons.

A metallization paste can comprise less than 1.5 wt % of a siloxane, less than 1 wt % of a siloxane, less than 0.5 wt % of a siloxane, less than 0.4 wt %, less than 0.3 wt %, less than 0.2 wt % or less than 0.1 wt % of a siloxane, where wt % is based on the total weight of the metallization paste.

A metallization paste can comprise, for example, from 0.1 wt % to 1 wt % of a siloxane, from 0.1 wt % to 0.8 wt %, for 0.2 wt % to 0.7 wt %, or from 0.3 wt % to 0.6 wt % of a siloxane, where wt % is based on the total weight of the metallization paste.

A metallization paste can comprise, for example, from 0.01 wt % to 0.4 wt % of a polysiloxane-modified resin and from 0.01 wt % to 6 wt % of a polysiloxane, from 0.01 wt % to 0.3 wt % of a polysiloxane-modified resin and from 0.1 wt % to 5 wt % of a polysiloxane, or from 0.01 wt % to 0.2 wt % of a polysiloxane-modified resin and from 0.1 wt % to 4 wt % of a polysiloxane.

A siloxane can have a fine powder size of no more than a few micron and can swell in an appropriate solvent, such as glycol ether and/or glycol ether acetate, used in the organic vehicle.

A siloxane can be a liquid, a solid, or a combination thereof. A siloxane can be supplied in the form of a fluid, an emulsion, an elastomer, and/or a resin. A siloxane elastomer can comprise a siloxane having, for example, hydroxyl, alkenyl, epoxy, isocyanate, amine, or other reactive functional groups or side chains. The reactive functional groups or side chains can be selected to be reactive with for example, esters or other components of the metallization paste.

As a solid, a siloxane can be in the form of particles, where the particles can have dimensions, for example, less than 20 µm, less than 15 µm, less than 10 µm, less than 5 µm, less than 1 µm, less than 0.5 µm, or less than 0.1 µm. Particles can have an average dimension, for example, from 0.1 µm to 20 µm, from 0.1 µm to 15 µm, from 0.1 µm to 10 µm, or from 1 µm to 10 µm.

In certain embodiments, a siloxane particle can swell in the presence of a solvent used in the metallization paste. For example, a siloxane particle can swell in the presence of glycol ether and/or glycol ether acetate, or other metallization paste solvent. In certain embodiments, a siloxane particle does not swell in the presence of a solvent or other component used in the metallization paste.

Siloxanes can be selected to impart shear-thinning behavior in low concentration to a metallization paste and yield suitable thixotropic properties and storage modulus at high shear rate.

The use of siloxanes such as polysiloxane-modified resins can also improve the hydrophobicity of a metallization paste.

A solar cell metallization paste can contain from 55 wt % to 95 wt % Ag particles, less than 5 wt % glass frit, and less than 10 wt % of vehicle binder, where wt % is based on the total weight of the metallization paste.

A metallization paste can contain from 80 wt % to 95 wt % Ag particles, from 2 wt % to 4 wt % glass frit, and from 6 wt % to 10 wt % of an organic vehicle, where wt % is based on the total weight of the metallization paste.

A metallization paste can contain from 85 wt % to 95 wt % Ag particles, from 2.5 wt % to 3.5 wt % glass frit, and from 7 wt % to 9 wt % of an organic vehicle, where wt % is based on the total weight of the metallization paste.

Metallization paste compositions provided by the present disclosure can include silver particles as the primary electrically conductive material. The silver particles can have an average particle diameter D50, for example, from 1 μm to 200 μm, from 1 μm to 150 μm, from 1 μm to 100 μm, from 1 μm to 50 μm, from 1 μm to 30 μm, or from 1 μm to 20 μm. The silver particles can comprise a combination of silver particles with the different silver particles characterized by a different mean particle diameter. The silver particles can be characterized by a distribution of particle diameters.

The silver particles can have an average particle diameter (D50), for example, from 0.1 μm to about 10 μm, or from 0.5 μm to 5 μm. The average particle diameter may be measured using, for example, using a Horiba LA-960 particle size analyzer after dispersing the conductive silver particles in isopropyl alcohol (IPA) at 25° C. for 3 minutes by ultrasonication. Within this range of average particle diameter, the composition can provide low contact resistance and low line resistance.

The silver particles may have, for example, a spherical, flake or amorphous shape, or a combination of any of the foregoing.

A metallization paste can comprise, for example, from 60 wt % to 95 wt %, from 70 wt % to 95 wt %, from 80 wt % to 95 wt %, or from 85 wt % to 95 wt % of silver particles, where wt % is based on the total weight of the metallization paste.

A metallization paste can include inorganic particles such as fumed silica.

Fumed silica can be used to control the degree of etching of the anti-reflection layer by the glass frit, and can minimize diffusion of the glass frit into the silicon wafer during the firing process, which would otherwise introduce undesirable impurities into the silicon substrate.

The fumed silica can be a synthetic silica prepared by a drying method, and may have a high purity of about 99.9% or more. The fumed silica may be prepared, for example, by thermal decomposition of a chlorosilane compound in a gas phase.

The fumed silica can have a specific surface area, for example, from 20 $m^2/g$ to 500 $m^2/g$, such as from 50 $m^2/g$ to t 200 $m^2/g$. Within this range, it is possible to adjust the degree of etching and secure the flow for minimizing diffusion of impurities into the wafer during the firing process, thereby reducing series resistance due to the diffusion of impurities while improving fill factor and conversion efficiency. In certain embodiments, the fumed silica may have a specific surface area of about 20 $m^2/g$, 30 $m^2/g$, 40 $m^2/g$, 50 $m^2/g$, 60 $m^2/g$, 70 $m^2/g$, 80 $m^2/g$, 90 $m^2/g$, 100 $m^2/g$, 110 $m^2/g$, 120 $m^2/g$, 130 $m^2/g$, 140 $m^2/g$, 150 $m^2/g$, 160 $m^2/g$, 170 $m^2/g$, 180 $m^2/g$, 190 $m^2/g$, or 200 $m^2/g$.

The fumed silica may be present in an amount, for example, of about 0.2 wt % or less, such as from 0.01 wt % to about 0.15 wt %, where wt % is based on the total weight of the composition. When the amount of fumed silica exceeds about 0.1 wt %, the viscosity of the composition can be too high for screen printing. The fumed silica may be present, for example, in an amount of 0.01 wt %, 0.02 wt %, 0.03 wt %, 0.04 wt %, 0.05 wt %, 0.06 wt %, 0.07 wt %, 0.08 wt %, 0.09 wt %, 0.1 wt %, where wt % is based on the total weight of the metallization paste. A metallization paste can comprise, for example, from 0.01 wt % to 0.15 wt %, from 0.03 wt % to 0.14 wt %, from 0.05 wt % to 0.13 wt %, from 0.07 wt % to 0.12 wt %, or from 0.09 wt % to 0.11 wt % fumed silica, where wt % is based on the total weight of the metallization paste.

Glass frit serves to enhance adhesion between the conductive silver particles and the silicon substrate and to form silver crystal grains in an emitter region by etching a passivation layer or antireflection coating (ARC) overlying the silicon substrate and aiding the partial dissolution or partial melting the silver particles so as to reduce contact resistance.

Glass frit can comprise a rare earth metal such as lanthanum, yttrium, or a combination thereof. Other suitable rare earth metals include scandium (Sc), cerium (Ce), praseodymium (Pr), neodymium Nd), promethium (Pm), samarium (Sm), europium (Eu), gadolinium (Gd), terbium (Tb), dysprosium (Dy), holmium (Ho), erbium Er), thulium (Tm), and lutetium (Lu).

Glass frit can comprise lead (Pb), bismuth (Bi), germanium (Ge), gallium (Ga), boron (B), iron (Fe), silicon (Si), zinc (Zn), tantalum (Ta), antimony (Sb), lanthanum (La), selenium (Se), phosphorus (P), chromium (Cr), lithium (Li), tungsten (W), magnesium (Mg), cesium (Cs), strontium (Sr), molybdenum (Mo), titanium (Ti), tin (Sn), indium (In), vanadium (V), barium (Ba), nickel (Ni), copper (Cu), sodium (Na), potassium (K), arsenic (As), cobalt (Co), zirconium (Zr), manganese (Mn), aluminum (Al), or a combination of any of the foregoing. For example, a glass frit can comprise lead Pb, tellurium Te, bismuth Bi, tungsten W, copper Cu, and a rare earth selected from lanthanum La, yttrium Y, or a combination thereof.

Glass frit can comprise lanthanum, lead, tellurium, bismuth, tungsten, and copper. For example, glass frit can comprise from 0.01 wt % to 1 wt % lanthanum, from 16 wt % to 36 wt % lead, from 34 wt % to 53 wt % tellurium, from 10 wt % to 25 wt % bismuth, from 0.09 wt % to 4.5 wt % tungsten, and from 0.1 wt % to 2 wt % copper, where wt % is based on the total weight of the glass frit. For example, glass frit can comprise from 0.01 wt % to 1 wt % lanthanum, from 24 wt % to 38 wt % lead, from 42 wt % to 45 wt % tellurium, from 16 wt % to 19 wt % bismuth, from 2 wt % to 4 wt % tungsten, and from 1 wt % to 3 wt % copper, where wt % is based on the total weight of the glass frit.

Glass frit can comprise yttrium, lead, tellurium, bismuth, tungsten, and copper. For example, glass frit can comprise from 0.01 wt % to 1 wt % yttrium, from 16 wt % to 36 wt % lead, from 34 wt % to 53 wt % tellurium, from 10 wt % to 25 wt % bismuth, from 0.09 wt % to 4.5 wt % tungsten, and from 0.1 wt % to 2 wt % copper, where wt % is based on the total weight of the glass frit. For example, glass frit can comprise from 0.01 wt % to 1 wt % yttrium, from 24 wt % to 38 wt % lead, from 42 wt % to 45 wt % tellurium, from 16 wt % to 19 wt % bismuth, from 2 wt % to 4 wt % tungsten, and from 1 wt % to 3 wt % copper, where wt % is based on the total weight of the glass frit.

Glass frit comprises lanthanum, yttrium, lead, tellurium, bismuth, tungsten, and copper. For example, a glass frit can comprise from 0.01 wt % to 1 wt % of a combination of lanthanum and yttrium, from 16 wt % to 36 wt % lead, from 34 wt % to 53 wt % tellurium, from 10 wt % to 25 wt % bismuth, from 0.09 wt % to 4.5 wt % tungsten, and from 0.1 wt % to 2 wt % copper, where wt % is based on the total weight of the glass frit. For example, glass frit can comprise from 0.01 wt % to 1 wt % of a combination of lanthanum and yttrium, from 24 wt % to 38 wt % lead, from 42 wt % to 45 wt % tellurium, from 16 wt % to 19 wt % bismuth, from 2 wt % to 4 wt % tungsten, and from 1 wt % to 3 wt % copper, where wt % is based on the total weight of the glass frit.

Glass frit may be formed from the corresponding oxides.

Glass frit can be formed from a composition comprising lanthanum oxide ($La_2O_3$), lead oxide (PbO), tellurium oxide (TeO), bismuth oxide ($Bi_2O_3$), tungsten oxide ($WO_3$), and copper oxide ($Cu_2O$). For example, glass frit can be prepared from a composition comprising from 0.01 wt % to 1 wt % lanthanum oxide, from 20 wt % to 60 wt % lead oxide, from 20 wt % to 60 wt % tellurium oxide, from 1 wt % to 30 wt % bismuth oxide, from 0.1 wt % to 5 wt % tungsten oxide, and from 0.1 wt % to 5 wt % copper oxide, where wt % is based on the total weight of the glass frit. For example, glass frit can be prepared from a composition comprising from 0.01 wt % to 1 wt % lanthanum oxide, from 21 wt % to 35 wt % lead oxide, from 40 wt % to 55 wt % tellurium oxide, from 15 wt % to 25 wt % bismuth oxide, from 2 wt % to 4 wt % tungsten oxide, and from 1 wt % to 2 wt % copper oxide, where wt % is based on the total weight of the glass frit.

Glass frit can be characterized, for example, by a molar ratio of bismuth Bi to tellurium Te from 0.01 to 0.5, from 0.05 to 0.4, from 0.1 to 0.3, or from 0.2 to 0.3. Glass frit can be characterized, for example, by an average particle diameter D50 within a range from 0.1 μm to about 20 μm, and may be present in the metallization paste in an amount of about 0.5 wt % to about 20 wt %, where wt % is based on the total weight of the metallization paste. The average particle diameter can be determined using a particle size analyzer. The glass frit may have, for example, a spherical or amorphous shape. A metallization paste composition can contain, for example, from 0.5 wt % to 5 wt % glass frit, from 1 wt % to 4 wt %, from 1.5 wt % to 4 wt %, or from 1.5 wt % to 3.5 wt %, where wt % is based on the total weight of the composition.

Glass frit can be characterized by a glass transition temperature ($T_g$) within a range from 200° C. to 800° C., such as, for example, within a range from 200° C. to 600° C., or within a range from 300° C. to 600° C.

Glass frit can comprise a combination of one or more types of glass frit having different average particle diameters and/or glass transition temperatures. For example, glass frit can comprise a combination of a first glass frit characterized by a glass transition temperature within a range from 200° C. to 320° C. and a second glass frit characterized by a glass transition temperature within a range from 300° C. to 550° C., where the weight ratio of the first glass frit to the second glass frit can range, for example, from about 1:0.2 to 1:1.

A metallization paste may also include an organic vehicle, where the organic vehicle can include, for example, an organic binder, an organic solvent, an additive, or a combination of any of the foregoing.

A metallization paste provided by the present disclosure can comprise, for example, from 0.01 wt % to 5 wt % of an organic binder; from 1 wt % to 45 wt % of a solvent; and from 0.01 wt % to 5 wt % of one or more additives, where wt % is based on the total weight of the composition.

An organic binder, also referred to as an organic resin, can be used to impart a desired viscosity and/or rheological property to a metallization paste to facilitate screen printing solar cell electrodes. The organic binder can also facilitate homogeneous dispersion of the inorganic component within the printable composition. A composition can comprise an organic binder or combination of organic binders.

Suitable organic binders include, for example, acrylate resins and cellulose resins such as ethylcellulose, ethyl hydroxyethylcellulose, nitrocellulose, blends of ethylcellulose and phenol resins, alkyd resins, phenol resins, acrylate esters, xylenes, polybutanes, polyesters, ureas, melamines, vinyl acetate resins, wood rosin, polymethacrylates of alcohols, and combinations of any of the foregoing.

Other suitable resins include, for example, ethyl cellulose, cellulose ester (CAB, CAP), polyacrylate, silicone (modified), polyvinyl butyral (PVB), polyvinyl pyrrolidone (PVP), saturated polyester, non-reactive polyamide (PA), modified polyether, and combinations of any of the foregoing. Other resins characterized by medium polarity may also be used. In certain embodiments, a resin comprises ethyl cellulose. A metallization paste provided by the present disclosure can comprise ethylcellulose as an organic binder.

The organic binder may be present in an amount from 0.1 wt % to 10 wt %, from 0.1 wt % to 6 wt %, from 0.1 wt % to 4 wt %, from 0.1 wt % to 2 wt %, or from 0.1 wt % to 1 wt %, where wt % is based on the total weight of the printable metallization paste.

An organic binder can comprise a siloxane or combination of siloxanes. An organic binder can comprise a siloxane and one or more other organic resins. An organic binder can consist essentially of a siloxane or combination of siloxanes, such as poly(dimethylsiloxane), a poly(dimethylsiloxane)-modified resin, poly(methylhydrosiloxane), a poly(methylhydrosiloxane)-modified resin, or a combination of any of the foregoing.

A metallization paste provided by the present disclosure can contain a binder such as ethylcellulose and a siloxane such as poly(dimethylsiloxane), a poly(dimethylsiloxane)-modified resin, poly(methylhydrosiloxane), a poly(methylhydrosiloxane)-modified resin, or a combination of any of the foregoing. The wt % ratio such as ethyl cellulose to a polysiloxane can be in the range of 0 to 0.5.

A metallization paste can comprise an organic solvent or combination of organic solvents.

An organic solvent can be used to impart solubility, dispersion, and/or coupling to the metallization paste. Some of the solvent in a metallization paste can be replaced with a siloxane provided by the present disclosure.

Examples of suitable solvents include terpineol, glycol ether, glycol ether acetate, Texanol™ (ester alcohol), tributyl citrate, tributyl O-acetylcitrate, DBE® esters (mixture of dimethyl adipate, dimethyl glutarate and dimethyl succinate); dimethyl phthalate (DMP), and combinations of any of the foregoing. A suitable solvent can have, for example, a boiling point greater than 200° C. and an evaporation rate less than 0.01 at room temperature. A suitable solvent can be an oxygenated solvent including alcohols such as ethanol, methanol, butanol, n-propyl alcohol, isobutyl alcohol, and isopropyl alcohols; esters such as ethyl acetate, n-butyl acetate, n-propyl acetate, and isopropyl acetate; and ketones such as acetone, diacetone alcohol, isophorone, cyclohexanone, methyl ethyl ketone, and methyl isobutyl ketone. Other suitable ethers, alcohols, and/or esters may also be used.

In certain embodiments, a solvent can comprise a glycol ether, glycol ether acetate, or a combination thereof.

Other examples of suitable solvents include hexane, toluene, ethyl cellusolve, cyclohexanone, butyl cellusolve, butyl carbitol (diethylene glycol monobutyl ether), dibutyl carbitol (diethylene glycol dibutyl ether), butyl carbitol acetate (diethylene glycol monobutyl ether acetate), propylene glycol monomethyl ether, hexylene glycol, terpineol, methylethylketone, benzyl alcohol, γ-butyrolactone, ethyl lactate, and combinations of any of the foregoing.

A metallization paste can include from 1 wt % to 15 wt %, from 2 wt % to 10 wt %, from 3 wt % to 9 wt %, or from 5 wt % to 8 wt % of an organic solvent, where wt % is based on the total weight of the printable, metallization paste.

A metallization paste may further include additives to modify the physical properties of the paste such as to enhance flow, process properties, and stability. Additives may include, for example, dispersants, thixotropic agents, plasticizers, viscosity stabilizers, anti-foaming agents, surfactants, pigments, UV stabilizers, antioxidants, coupling agents, and combinations of any of the foregoing.

An additive or combination of additives may be present in the composition in an amount, for example, from 0.1 wt % to about 5 wt %, from 0.1 wt % to 1.5 wt %, from 0.5 wt % to 1.5 wt % or from, 0.3 wt % to 1 wt %, where wt % is based on the total weight of the printable metallization paste. The additive can comprise a thixotropic additive, a dispersant, or a combination thereof.

A metallization paste can be characterized by a viscosity, for example, of less than 450 Pa-sec or less than 430 Pa-sec.

A metallization paste can exhibit a viscosity, for example, from 100 Pa-sec to 450 Pa-sec, such as from 100 Pa-sec to 360 Pa-sec determined using a Brookfield DV-III+ viscometer with a SC4-14 spindle at 10 rpm and a temperature of 25° C.

A metallization paste can exhibit a viscosity, for example, from 10 Pa-sec to 2,000 Pa-sec, from 25 Pa-sec to 1,500 Pa-sec, from 50 Pa-sec to 1,000 Pa-sec, from 75 Pa-sec to 750 Pa-sec, or from 100 Pa-sec to 500 Pa-sec, determined using a Brookfield DV-III+ viscometer with a SC4-14 spindle at 10 rpm and a temperature of 25° C. A metallization paste can exhibit a viscosity, for example, from 100 Pa-sec to 500 Pa-sec, from 125 Pa-sec to 400 Pa-sec, from 150 Pa-sec to 350 Pa-sec, or from 200 Pa-sec to 300 Pa-sec determined using a Brookfield DV-III+ viscometer with a SC4-14 spindle at 10 rpm and a temperature of 25° C. A metallization paste with an organic vehicle characterized by a surface tension from 5 dyn/cm to 35 dyn/cm, from 10 dyn/cm to 30 dyn/cm from 15 dyn/cm to 30 dyn/cm or from 18 dyn/cm to 25 dyn/cm, determined using the capillary method.

A printable metallization paste can include, for example, from 0.1 wt % to 1 wt % of a siloxane, from 80 wt % to 95 wt % Ag particles, from 1 wt % to 5 wt % of glass frit, from 0.025 wt % to 0.2 wt % fumed silica, from 0.2 wt % to 0.6 wt % organic binder, from 5 wt % to 9 wt % solvent, from 0.2 wt % to 1 wt % thixotropic additive, and from 0.05 wt % to 0.35 wt % dispersant, where wt % is based on the total weight of the printable metallization paste.

A printable metallization paste can include, for example, from 0.2 wt % to 0.6 wt % of a siloxane, from 85 wt % to 92 wt % Ag particles, from 1.5 wt % to 4 wt % of glass frit, from 0.05 wt % to 0.15 wt % fumed silica, from 0.3 wt % to 0.5 wt % organic binder, from 5.5 wt % to 8 wt % solvent, from 0.3 wt % to 0.7 wt % thixotropic additives, and from 0.1 wt % to 0.3 wt % dispersant, where wt % is based on the total weight of the printable metallization paste.

A printable metallization paste can comprise, for example, from 83 wt % to 95 wt % silver particles, form 1 wt % to 5 wt % glass frit, from 0.01 wt % to 1 wt % silica, from 0.1 wt % to 1 wt % binder, from 2 wt % to 10 wt % solvent, from 0.1 wt % to 2 wt % additives, and from 0.1 wt % to 1 wt % siloxanes.

A printable metallization paste can comprise, for example, from 85 wt % to 93 wt % silver particles, form 2 wt % to 4 wt % glass frit, from 0.05 wt % to 0.5 wt % silica, from 0.2 wt % to 0.5 wt % binder, from 4 wt % to 8 wt % solvent, from 0.5 wt % to 1.5 wt % additives, and from 0.2 wt % to 0.7 wt % siloxanes.

For screen printing fine lines with a high aspect ratio it is desirable that a metallization paste provided by the present disclosure exhibit a viscosity within the range from 50 Pa-sec to 700 Pa-sec at a temperature from 15° C. to 50° C., as determined using a Brookfield DV-III+ viscometer with a SC4-14 spindle at 10 rpm and a temperature of 25° C. For example, an electrode can be characterized by an aspect ratio greater than 0.3, greater than 0.4, greater than 0.5, greater than 0.6, greater than 0.7, greater than 0.8, greater than 0.9, or greater than 1, where aspect ratio refers to the line height divided by the line width. An electrode can have an aspect ratio, for example, from 0.3 to 1, from 0.4 to 0.8, from 0.4 to 0.6, from 0.5 to 1, or from 0.5 to 0.8.

It can also be desirable that a metallization paste exhibit a glass transition temperature $T_g$ from 200° C. to 800° C. as determined using differential scanning calorimetry (DSC).

The metallization paste can be prepared using the following procedure.

The glass frit can be prepared by combining the metal oxides, melting the combined metal oxides to form a glass, quenching the glass, and milling the glass to provide glass frit with a desired mean particle diameter and dispersity.

The organic vehicle can be prepared by mixing and heating a solvent or mixture of solvents and organic binder or organic binders, and additives such as rheological thixotropic additive, plasticizer, and/or defoaming agents; and siloxanes.

Silver Ag particles can be combined with the organic vehicle, and glass frit, inorganic particles and other components such as siloxanes and thoroughly mixed.

The metallization paste can then be milled to achieve a desired dispersion of the inorganic components. The metallization paste can then be filtered to remove any undesired large particulates.

The metallization paste can be applied to a front surface of a silicon solar cell by screen printing. The screen used in solar cell screen printing can be a mesh covered by an emulsion which is patterned to form the grid pattern. The mesh number can be, for example, from 300 mesh to 800 mesh, from 300 mesh to 400 mesh, such as from 325 mesh to 380 mesh and the mesh wire, which can be stainless steel, can have a diameter from about 0.3 mils to 1.5 mils, such as a diameter from 0.4 mils to 1.1 mils. Other screens and mesh sizes can be used as appropriate for a particular metallization paste, process conditions, and desired feature sizes.

The deposited metallization paste in the form of electrical conductors such as grid lines can have, for example, a width from 0.5 mils to 4 mils, and a height from 0.1 mils to 1.5 mils.

After being applied to a Si substrate, the screen-printed composition can be dried, for example, at a temperature from 200° C. to 400° C. for from 10 seconds to 60 seconds, and then baked and fired at a temperature from 400° C. to 950° C., or from 30 seconds to 50 seconds, with a peak firing temperature in the range of 750° C. to 950° C., to provide frontside electrical conductors.

Electrical conductors having dimensions of 1.2 mm width and 16 µm height can exhibit electrical resistivity of 1.8 µΩ-cm and can exhibit an adhesion strength of at least 2 N on a silicon substrate, where the electrical conductivity is determined according to line resistivity electrical probe measurement and the adhesion strength is determined according to a 180° solder tab pull test. For context, Ag thick-film busbars having a resistivity less than 2 µΩ-cm and an adhesion strength greater than 1.5 N are generally considered acceptable for use in the solar cell industry.

Solar cell conductive electrodes prepared from compositions provided by the present disclosure maintain acceptable conductivity and adhesion strength following exposure to accelerated environmental test conditions including damp-heat testing and accelerated thermal cycling, which are used to qualify solar cells for a 25-year service life.

FIG. 1 is a graph showing the viscosity of metallization pastes with shear rate. FIG. 1 shows a hysteresis curve of the viscosity of metallization pastes with increasing and then decreasing shear rate. For metallization paste A the organic binder was ethylcellulose and did not contain a siloxane. For metallization paste B some of the solvent was replaced with a polysiloxane, As shown by the shear-thinning flow curves, a siloxane, in this case poly(methylhydrosiloxane), reduced the initial viscosity (zero shear) and maintained the shear-thinning and thixotropic behavior at increasing shear rates. At high shear rates the siloxane-containing metallization paste exhibited the same low viscosity as the metallization paste without a siloxane. The shear rate (1/sec) dependent viscosity in FIG. 1 was determined using a Brookfield DV-III+ rheometer RIS-CP+ with spindle RC3-25-1 at a temperature of 25° C.

In Paste C a polysiloxane-modified resin was used in the metallization paste which significantly improved the thixotropic behavior compared with Pastes A and B. The initial viscosity was similar to that of paste B, as shown in the rheology graph of FIG. 1. Paste C had the highest print wet-weight (see Table 4) for the same print speed as the other pastes, which resulted in superior electrical performance for the solar cell employing Paste C. Solar cells having gridlines prepared with Paste C exhibited the highest short-circuit current of 9.3 A. Paste C is the highest wet weight (0.128 g) compared to the other metallization pastes evaluated. Also, gridlines prepared using Paste C exhibit the narrowest median line width of about 41 µm, gridlines are less wavy compared to gridlines prepared using the other metallization pastes as reflected by the maximum and minimum widths, and have the highest aspect ratio due to increased height. Due to at least these factors, solar cells having gridlines prepared using Paste C exhibit the highest photocurrent.

Figure 2A:
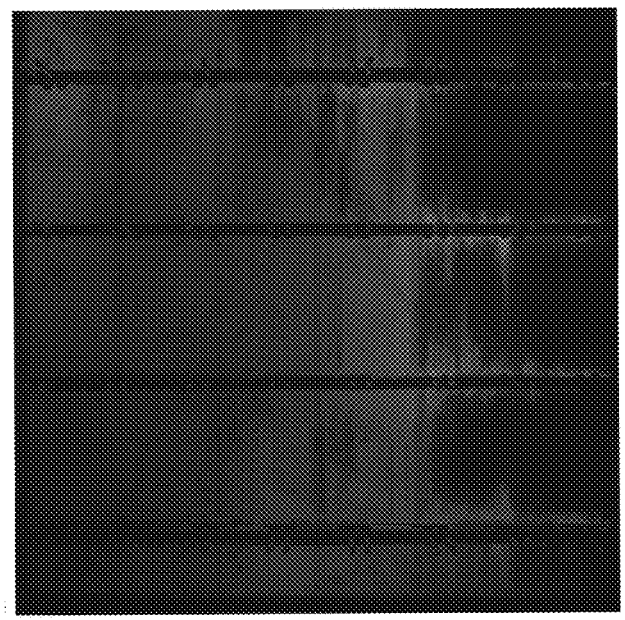
FIG. 2A shows an EL image of gridlines on a monocrystalline silicon solar cell printed using a metallization paste without a siloxane additive.
Figure 2B:
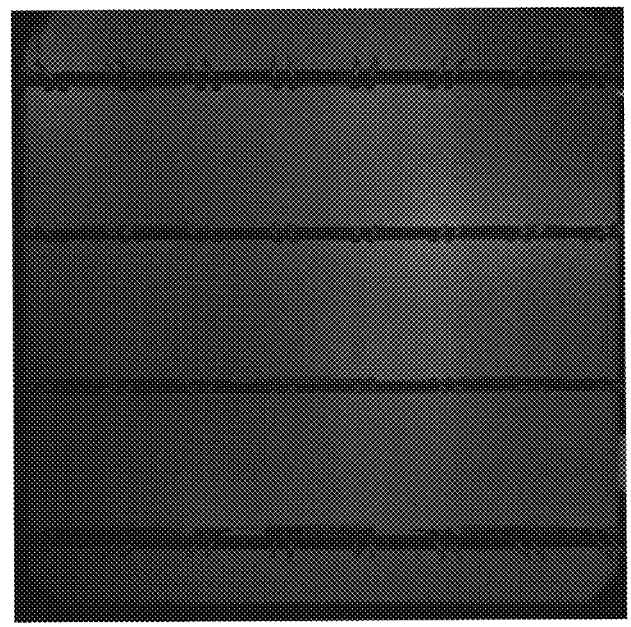
FIG. 2B shows an electroluminescence (EL) of gridlines on a monocrystalline silicon solar cell printed using a metallization paste with a siloxane additive. The dark regions in the EL images represent discontinuities in the printed gridlines causing higher electrical resistance to current flow.

FIGS. 2A and 2B show electroluminescence (EL) images of gridlines on a microcrystalline silicon solar cell printed using a metallization paste without a polysiloxane-modified resin and with a polysiloxane-modified resin, respectively.

FIG. 2A and FIG. 2B demonstrate the effects of including a polysiloxane in a metallization paste on solar cell gridline integrity. FIG. 2B shows an electroluminescence image of a polycrystalline silicon solar cell in which gridlines having a width of about 41 µm were printed using a metallization paste comprising both a polysiloxane (poly(methylhydrosiloxane)) and a polysiloxane-modified resin (polydimethylsiloxane-modified resin). The composition metallization paste is described in Example 3 and the process for fabricating the gridlines is described in Example 1. FIG. 2A shows an electroluminescence image of a polycrystalline silicon solar cell with gridlines fabricated as in FIG. 2B, except that the metallization paste did not contain a polysiloxane-modified resin. As can be appreciated by comparing the electroluminescence images shown in FIG. 2A and FIG. 2B, the number of gridline discontinuities is reduced using a metallization paste containing a polysiloxane-modified resin compared to the solar cell having grid lines prepared using a metallization paste without a polysiloxane-modified resin.

Silicon solar cells having electrodes made from the metallization pastes provided by the present disclosure can be incorporated into photovoltaic modules and photovoltaic systems.

According to an aspect of the invention, a metallization paste comprises from 0.01 wt % to 3 wt % of a siloxane, wherein the siloxane comprises a polysiloxane, a polysiloxane-modified resin, or a combination thereof; and wt % is based on the total weight of the metallization paste.

According to any of the preceding aspects, the siloxane comprises a polysiloxane-modified resin.

According to any of the preceding aspects, the siloxane comprises a poly(methylhydrosiloxane), a poly(methylhydrosiloxane)-modified resin or a combination of any of the foregoing.

According to any of the preceding aspects, the siloxane comprises a poly(methylhydrosiloxane) and a polydimethylsiloxane-modified resin.

According to any of the preceding aspects, the siloxane is characterized by a molecular weight from 1,500 Daltons to 4,000 Daltons, and a viscosity from 10 cSt to 60 cSt.

According to any of the preceding aspects, the siloxane is characterized by a molecular weight from 500 Daltons to 20,000 Daltons.

According to any of the preceding aspects, the metallization paste comprises glycol ether, glycol ether acetate, or a combination thereof.

According to any of the preceding aspects, the metallization paste is characterized by a viscosity less than 370 Pa-sec determined using a Brookfield DV-III+ viscometer with a SC4-14 spindle at 10 rpm and a temperature of 25° C.

According to any of the preceding aspects, the metallization paste is characterized by a viscosity within a range from 190 Pa-sec to 350 Pa-sec determined using a Brookfield DV-III+ viscometer with a SC4-14 spindle at 10 rpm and a temperature of 25° C.

According to any of the preceding aspects, the metallization paste is characterized by a viscosity within a range from 190 Pa-sec to 350 Pa-sec determined using a Brookfield DV-III+ viscometer with a SC4-14 spindle at 10 rpm and a temperature of 25° C.; and a surface tension within a range from 5 dyn/cm to 35 dyn/cm.

According to any of the preceding aspects, the metallization paste further comprises silver particles and glass frit.

According to any of the preceding aspects, the metallization paste is characterized by a surface tension within a range from 15 dyn/cm to 30 dyn/cm.

According to an aspect of the invention, a solar cell electrode is prepared from the metallization paste according to the present invention.

According to any of the preceding aspects, the electrode is characterized by an aspect ratio greater than 0.4.

According to an aspect of the invention, a solar cell electrode is prepared by applying the metallization paste according to the present invention to a surface of a solar cell; drying the applied metallization paste; and firing the dried metallization paste to provide a solar cell electrode.

According to any of the preceding aspects, applying the metallization paste comprises screen printing the metallization paste through a wire screen having a 300 mesh to 400 mesh, at a printing speed of at least 200 mm/sec.

According to any of the preceding aspects, the electrode is characterized by an aspect ratio greater than 0.4.

According to an aspect of the invention, a method of fabricating a solar cell electrode, comprises applying the metallization paste according to the present invention to a surface of a solar cell; drying the applied metallization paste; and firing the dried metallization paste to provide a solar cell electrode.

According to any of the preceding aspects, applying the metallization paste comprises screen printing the metallization paste through a wire screen having a 300 mesh to 400 mesh, at a printing speed of at least 200 mm/sec.

EXAMPLES

Embodiments provided by the present disclosure are further illustrated by reference to the following examples, which describe solar cell metallization pastes and properties of gridlines formed using the metallization pastes according to the present invention. It will be apparent to those skilled in the art that many modifications, both to materials, and methods, may be practiced without departing from the scope of the disclosure.

Example 1

Metallization Paste

A metallization paste without added siloxane was prepared from the components listed in Table 1.

TABLE 1

Metallization Paste A.

| Material | Product No. | Source | Content (wt %) |
|---|---|---|---|
| Ag Particles | AG-4-8 | Dowa Hightech | 89 |
| Glass Frit | Pb—Te—Bi glass | Internal | 3 |
| Fumed Silica | Aerosil® 200 | Evonik Co. | 0.1 |
| Binder | ETHOCEL™ Ethylcellulose STD4 | Dow Chemical | 0.4 |
| Solvent | Texanol™ ester alcohol | Eastman Chemical | 6.8 |
| Thixotropic Additive | Thixatrol® ST | Elementis Co. | 0.5 |
| Dispersant | DISPERBYK® 102 | BYK-chemie | 0.2 |

To prepare the metallization paste, an organic binder, 0.4 wt % of ETHOCEL™ ethylcellulose (STD4, Dow Chemical Company), was dissolved in 6.8 wt % of Texanol™ (Texanol™ ester-alcohol, Eastman Chemical Company) at 60° C., and 89 wt % of spherical silver particles (AG-4-8, Dowa Hightech Co., Ltd.) having an average particle diameter of 2.0 μm, 3 wt % glass frit having an average particle diameter of 1.0 μm and a transition temperature $T_g$ of 350° C., 0.1 wt % of fumed silica (Aerosil® 200, Evonik Co., Ltd.) having a BET specific surface area of 200±25 m$^2$/g, 0.2 wt % of a dispersant (DISPERBYK® 102, BYK-chemie), and 0.5 wt % of a thixotropic agent (Thixatrol® ST, Elementis Co., Ltd.) were added to the binder solution, followed by mixing and kneading in a 3-roll mill, to prepare a screen printable metallization paste.

The composition was deposited by screen printing in a predetermined pattern over a front surface of a silicon wafer having an anti-reflective coating with an underlying doped Si emitter with sheet resistance of about 85 Ω/sq, followed by drying in an infrared (IR) drying furnace to remove solvent. The metallization paste was screen printed through a stainless steel wire mesh onto a monocrystalline silicon solar cell at a speed of 350 mm/sec to provide lines that were nominally 40 μm wide and 20 μm high.

During the drying process the printed gridlines were exposed to a temperature of about 850° C. for about 1 sec to provide sintering and ohmic contact for the solar cell electrode metallization. Then, an aluminum paste was printed on the back side of the silicon wafer and dried in the same manner. Solar cells formed according to this procedure were then subjected to firing at 400° C. to 950° C. for 30 sec to 50 sec, where the peak temperature is in the range of 750° C. to 950° C. in a belt-type radiation-lamp firing furnace. The fill factor (FF) and the conversion efficiency (%) of the cells were determined using a solar cell efficiency tester PSS 10 II (Berger Lichttechnik GmbH & Co.). The FF was determined according to current-voltage curve as the ratio of the maximum-power-point to the product of the open-circuit voltage and short-circuit current. Efficiency was determined from the current-voltage curve as the percent ratio of the maximum-power-point to the input power of the incident light on the solar cell from a solar simulator.

The shear-rate dependent viscosity of the siloxane-containing metallization paste A is shown in FIG. 1.

The viscosity of metallization paste A was 440 Pa-sec at a 1/se shear rate and had a Fineness of Grain (FoG) of 5 μm.

Example 2

Metallization Paste Containing a Siloxane

A siloxane-containing metallization paste was prepared from the components listed in Table 2.

TABLE 2

Siloxane-containing Metallization Paste B.

| Material | Product No. | Source | Content (wt %) |
|---|---|---|---|
| Ag Particles | AG-4-8 | Dowa Hightech | 89 |
| Glass Frit | Pb—Te—Bi glass | Internal | 3 |
| Fumed Silica | Aerosil® 200 | Evonik Co. | 0.1 |
| Binder | ETHOCEL™ Ethylcellulose STD4 | Dow Chemical | 0.4 |
| Solvent | Texanol™ ester alcohol | Eastman Chemical | 6.3 |
| Thixotropic Additive | Thixatrol® ST | Elementis Co. | 0.5 |
| Dispersant | DISPERBYK® 102 | BYK-chemie | 0.2 |
| Polysiloxane | Poly(methylhydrosiloxane) No. 176206 | Sigma Aldrich | 0.5 |

The metallization paste was prepared and applied to monocrystalline solar cells as in Example 1.

The shear-rate dependent viscosity of the siloxane-containing metallization paste B is shown in FIG. 1.

The viscosity of metallization paste B (Example 2) was 427 Pa-sec at a 1/sec shear rate and had a FoG of 5 μm.

Example 3

Metallization Paste Containing a Siloxane and a Siloxane-Modified Resin

A siloxane-containing metallization paste was prepared from the components listed in Table 5.

TABLE 5

Siloxane-containing Metallization Paste C.

| Material | Product No. | Source | Content (wt %) |
|---|---|---|---|
| Ag Particles | AG-4-8 | Dowa Hightech | 89 |
| Glass Frit | Pb—Te—Bi glass | Internal | 2.9 |
| Fumed Silica | Aerosil ® 200 | Evonik Co. | 0.1 |
| Binder | ETHOCEL ™ Ethylcellulose STD4 | Dow Chemical | 0.4 |
| Solvent | Texanol ™ ester alcohol | Eastman Chemical | 6.5 |
| Thixotropic Additive | Thixatrol ® ST | Elementis Co. | 0.5 |
| Dispersant | DISPERBYK ® 102 | BYK-chemie | 0.2 |
| Polysiloxane | Poly(methylhydrosiloxane) No. 176206 | Sigma Aldrich | 0.3 |
| Polydimethylsiloxane-Modified Resin | n/a | n/a | 0.1 |

The metallization paste containing both a polysiloxane and a polysiloxane-modified resin was applied to a monocrystalline solar cell as described in Example 2 and fired to obtain fine gridlines on the front surface of the solar cell.

The shear-rate dependent viscosity of the siloxane-containing metallization paste C is shown in FIG. 1.

The viscosity of metallization paste C was 370 Pa-sec at a 1/sec shear rate and had a FoG of 5 μm.

Electroluminescence (EL) images of solar cells with gridlines prepared using the metallization paste of Example 1 and with the metallization paste of Example 3 are shown in FIG. 2A and FIG. 2B, respectively.

Example 4

Comparative Results

The line widths for gridlines formed using the three metallization pastes are shown in Table 3.

TABLE 3

Gridline width.

| Gridline Width | Reference Paste* | Example 1 Paste A | Example 2 Paste B | Example 3 Paste C |
|---|---|---|---|---|
| Avg (μm) | 41.95 | 46.08 | 40.41 | 41.6 |
| Min (μm) | 37.89 | 41.51 | 34.81 | 39.37 |
| Max (μm) | 47.79 | 52.08 | 44.45 | 44.45 |
| Median (μm) | 42.26 | 45.85 | 41.37 | 41.1 |

*Reference paste refers to a metallization paste used as a standard.

The electrical properties of gridlines fabricated using the two metallization pastes, with and without a siloxane additive, is shown in Table 4.

TABLE 4

Gridline Electronic and Print Properties.

| Paste | Uoc (V) | Isc (A) | Rs (Ω) | Rsh (Ω) | FF | Efficiency (%) | Print Wet Weight (g) |
|---|---|---|---|---|---|---|---|
| Example 3 (C) polydimethylsiloxane-modified resin | 0.639 | 9.3 | 0.00227 | 36.1 | 79.4 | 19.49 | 0.128 |
| Example 2 (B) (polysiloxane) | 0.638 | 9.160 | 0.00181 | 118.7 | 80.3 | 19.4 | 0.105 |
| Example 1 (A) | 0.638 | 9.141 | 0.00173 | 92.7 | 80.4 | 19.3 | 0.114 |
| Reference Paste | 0.638 | 9.148 | 0.00168 | 59.6 | 80.4 | 19.4 | 0.125 |

In Table 4, Uoc refers to the open circuit voltage, Isc is the short circuit current, Rs is the sheet resistance, Rsh is the shunt resistance, FF is the fill factor, efficiency represents the efficiency of the solar cell.

It should be noted that there are alternative ways of implementing the embodiments disclosed herein. Accordingly, the present embodiments are to be considered as illustrative and not restrictive. Furthermore, the claims are not to be limited to the details given herein, and are entitled their full scope and equivalents thereof.

What is claimed is:

1. A method of fabricating a solar cell electrode, comprising:
    applying a metallization paste to a surface of a solar cell, wherein the metallization paste comprises:
        silver particles;
        from 0.01 wt % to 0.6 wt % of a liquid polymethylhydrosiloxane; and
        from 0.01 wt % to 0.4 wt % of a polysiloxane-modified resin;
        wherein wt % is based on the total weight of the metallization paste;
    drying the applied metallization paste; and
    firing the dried metallization paste to provide a solar cell electrode.

2. The method of claim 1, wherein applying the metallization paste comprises screen printing the metallization paste through a wire screen having a 300 mesh to 800 mesh, at a printing speed of at least 200 mm/sec.

3. The method of claim 1, wherein the solar cell electrode is characterized by an aspect ratio greater than 0.4.

4. The method of claim 1, wherein the polysiloxane-modified resin comprises a polysiloxane-modified block copolymer, a polysiloxane-modified graft copolymer, or a combination thereof.

5. The method of claim 1, wherein the polysiloxane-modified resin comprises a polysiloxane-modified block copolymer.

6. The method of claim 1, wherein the polysiloxane-modified resin comprises a polysiloxane-modified graft copolymer.

7. The method of claim 1, wherein the polysiloxane-modified resin is characterized by:
    a molecular weight from 1,500 Daltons to 4,000 Daltons; and
    a viscosity from 10 cSt to 60 cSt, wherein viscosity is determined using a Brookfield DV-III+ viscometer with a SC4-14 spindle at 10 rpm at a temperature of 25° C.

8. The method of claim 1, wherein the polysiloxane-modified resin is characterized by a molecular weight from 500 Daltons to 20,000 Daltons.

9. The method of claim 1, wherein the polysiloxane-modified resin comprises a polydimethylsiloxane-modified resin, a poly(methylhydrosiloxane)-modified resin, or a combination thereof.

10. The method of claim 1, wherein the polysiloxane-modified resin comprises a polydimethylsiloxane-modified resin.

11. The method of claim 1, wherein the metallization paste comprises glycol ether, glycol ether acetate, or a combination thereof.

12. The method of claim 1, wherein the metallization paste is characterized by a viscosity less than 370 Pa×sec determined using a Brookfield DV-III+ viscometer with a SC4-14 spindle at 10 rpm and a temperature of 25° C.

13. The method of claim 1, wherein the metallization paste is characterized by a surface tension within a range from 5 dyn/cm to 35 dyn/cm, wherein the surface tension is determined using the capillary method.

14. The method of claim 1, wherein the metallization paste further comprises glass frit.

15. The method of claim 1, wherein the metallization paste comprises:

from 80 wt % to 95 wt % of silver particles;
from 0.01 wt % to 0.6 wt % of a liquid polymethylhydrosiloxane;
from 0.01 wt % to 0.4 wt % of a polydimethylsiloxane-modified resin;
from 2 wt % to 4 wt % of glass frit; and
from 3 wt % to 9 wt % of a solvent;
wherein wt % is based on the total weight of the metallization paste;
wherein the metallization paste is characterized by a viscosity from 100 Pa×sec to 450 Pa×sec, wherein the viscosity is determined using a Brookfield DV-III+ viscometer with a SC4-14 spindle at 10 rpm and a temperature of 25° C.

16. A solar cell comprising an electrode prepared by the method of claim 1.

17. A photovoltaic module comprising the solar cell of claim 16.

18. A photovoltaic system comprising the photovoltaic module of claim 17.

* * * * *